United States Patent
Farshchian et al.

(10) Patent No.: US 10,433,461 B2
(45) Date of Patent: Oct. 1, 2019

(54) HIGH-PERFORMANCE ELECTRONICS COOLING SYSTEM

(71) Applicant: Google LLC, Mountain View, CA (US)

(72) Inventors: Soheil Farshchian, San Jose, CA (US); Emad Samadiani, Mountain View, CA (US)

(73) Assignee: Google LLC, Moutain View, CA (US)

(*) Notice: Subject to any disclaimer, the term of this patent is extended or adjusted under 35 U.S.C. 154(b) by 0 days.

(21) Appl. No.: 15/797,996

(22) Filed: Oct. 30, 2017

(65) Prior Publication Data
US 2019/0132992 A1    May 2, 2019

(51) Int. Cl.
*F28D 11/06*    (2006.01)
*F28G 7/00*    (2006.01)
(Continued)

(52) U.S. Cl.
CPC ......... *H05K 7/20336* (2013.01); *F28D 15/04* (2013.01); *F28D 15/046* (2013.01);
(Continued)

(58) Field of Classification Search
CPC ... H05K 7/20336; F28D 15/04; F28D 15/043; F28D 15/0275; F28D 15/0266; F24F 3/1417
(Continued)

(56) References Cited

U.S. PATENT DOCUMENTS

| | | |
|---|---|---|
| 4,047,198 A | 9/1977 | Sekhon et al. |
| 6,410,982 B1 | 6/2002 | Brownell et al. |

(Continued)

FOREIGN PATENT DOCUMENTS

| | | |
|---|---|---|
| CN | 102095323 A | 6/2011 |
| TW | 258337 U | 3/2005 |

(Continued)

OTHER PUBLICATIONS

International Search Report and Written Opinion dated Nov. 16, 2018 in International (PCT) Application No. PCT/US2018/050041.
(Continued)

*Primary Examiner* — Davis D Hwu
(74) *Attorney, Agent, or Firm* — McDermott Will & Emery LLP

(57) ABSTRACT

A cooling system for an electronic circuit package is provided. The cooling system includes a heat transfer plate positioned in thermal contact with an electronic circuit package surface and forming the bottom surface of an evaporative region of the cooling system. The cooling system also includes a plurality of condensing tubes in fluid communication with, and extending away from, the evaporative region, such that the evaporative region and the condensing tubes together form a single, uninterrupted, sealed enclosure. The cooling system also includes a fluid within the sealed enclosure. The cooling system also includes a plurality of spacers filling gaps between the heat transfer plate and the condensing tubes, such that each spacer is configured as an independent component to allow the passage of fluid through the interior space of each spacer. The cooling system also includes a plurality of wicks, where each wick is positioned partially within a corresponding spacer to which it is fluidically coupled.

20 Claims, 8 Drawing Sheets

(51) Int. Cl.
    *H05K 7/20*         (2006.01)
    *F28D 15/04*       (2006.01)
    *H01L 23/427*     (2006.01)

(52) U.S. Cl.
    CPC ........ *H01L 23/427* (2013.01); *F28F 2215/06* (2013.01); *F28F 2240/00* (2013.01)

(58) Field of Classification Search
    USPC ............................................................ 165/84
    See application file for complete search history.

(56) References Cited

U.S. PATENT DOCUMENTS

| | | | |
|---|---|---|---|
| 6,994,152 | B2 | 2/2006 | Rosenfeld et al. |
| 7,705,342 | B2 | 4/2010 | Henderson et al. |
| 7,957,132 | B2 * | 6/2011 | Fried .................. F28D 15/0266 165/185 |
| 8,587,944 | B2 | 11/2013 | Trautman |
| 2002/0056908 | A1 | 5/2002 | Brownell et al. |
| 2006/0237167 | A1 | 10/2006 | Lee |
| 2009/0040726 | A1 | 2/2009 | Hoffman et al. |
| 2010/0200200 | A1 | 8/2010 | Tonosaki et al. |
| 2012/0247735 | A1 * | 10/2012 | Ito ...................... F28D 15/0275 165/104.21 |
| 2014/0240918 | A1 | 8/2014 | Damaraju et al. |
| 2014/0332187 | A1 | 11/2014 | MacDonald et al. |

FOREIGN PATENT DOCUMENTS

| | | |
|---|---|---|
| TW | 455153 U | 6/2013 |
| WO | 2006074583 A1 | 7/2006 |

OTHER PUBLICATIONS

Bar-Cohen, Avram, et al. "Two-Phase Thermal Ground Planes: Technology Development and Parametric Results" Journal of Electronic Packaging, vol. 137, No. 1, Paper 010801, Mar. 2015. Retrieved from URL: https://electronicpackaging.asmedigitalcollection. asme.org/journal.aspx.

Hogue, Christopher William. "An Experimental Study of Enhanced Thermal Conductivity Utilizing Columnated Silicon Microevaporators for Convective Boiling Heat Transfer at the Microscale" Dissertation, University of California, Berkeley, Fall 2011. Retrieved from URL: http://digitalassets.lib.berkeley.edu/etd/ucb/text/Hogue_berkeley_0028E_11719.pdf.

Ponugoti, Priyanka, et al. "Study of Transient Behavior of the Evaporator of the Planar Micro Loop Heat Pipe" Retrieved on Oct. 30, 2017 from URL: https://tfaws.nasa.gov/TFAWS05/Website/files/ThermalPaperSession/TFAWS05_PPonugoti_TH.pdf.

Wang, Peng. "On-Chip Thermoelectric Cooling of Semiconductor Hot-Spot" Dissertation, University of Maryland, College Park, 2007. Retrieved from URL: https://www.google.com/url?sa=t&rct=j&q=&esrc=s&source=web&cd=7&cad=rja&uact=8&ved=0ahUKEwjF3Zvt0sDUAhUBzz4KHXxJCd8QFghNMAY&url=http%3A%2F%2Fdrum.lib.umd.edu%2Fbitstream%2Fhandle%2F1903%2F7413%2Fumi-umd-4843.pdf%3Fsequence%3D1%26isAllowed%.

Office Action dated Jun. 25, 2019 in Taiwanese Patent Application No. 107132170, and English translation thereof.

* cited by examiner

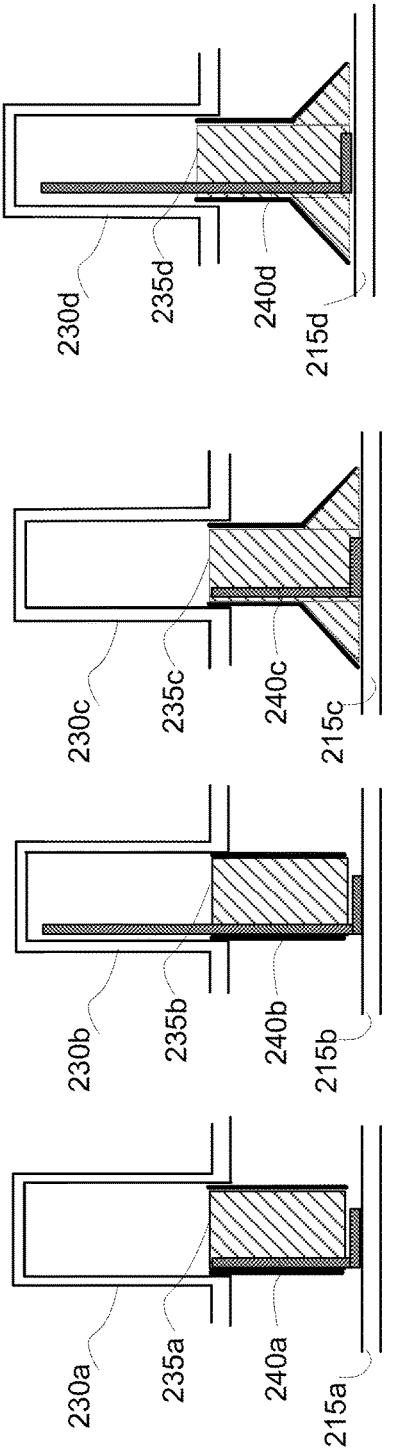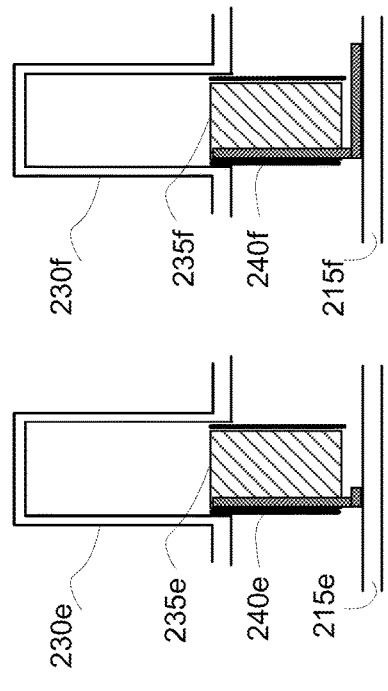

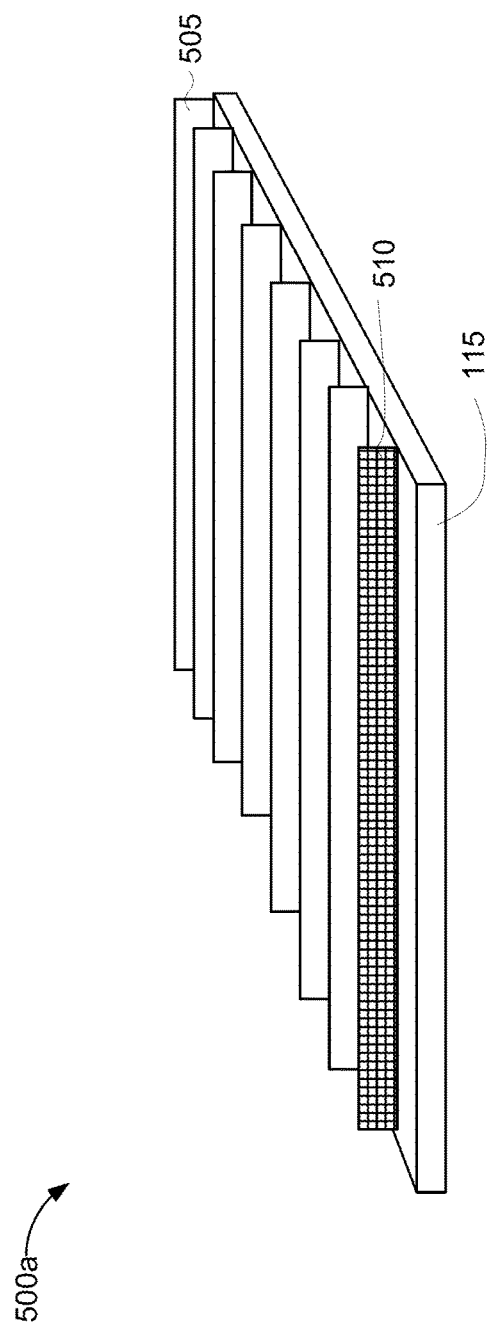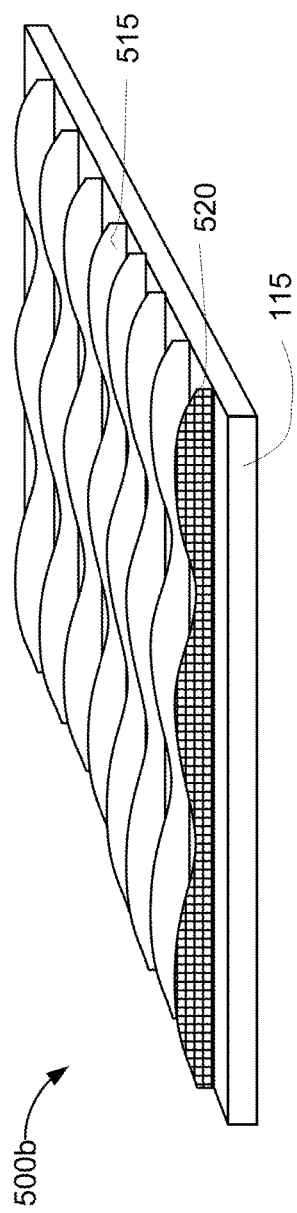

HIGH-PERFORMANCE ELECTRONICS COOLING SYSTEM

BACKGROUND

Cooling systems are traditionally used to dissipate heat generated by electronic circuit packages, such as an integrated circuit die package. Heat pipes and vapor chambers are components of such cooling systems. In addition, liquid cooling solutions are also used to transfer heat generated by such electronic circuit packages (ECPs). As ECP manufacturers develop advanced microprocessors for high-performance processing and computing applications, new advances in ECP cooling solutions are needed to adequately manage the increased heat that is generated by these more advanced components.

SUMMARY

According to one aspect, the disclosure relates to a cooling system for an electronic circuit package. The cooling system includes a heat transfer plate positioned in thermal contact with an electronic circuit package surface. The heat transfer plate forms a bottom surface of an evaporative region of the cooling system. The cooling system further includes a plurality of condensing tubes in fluid communication with, and extending away from, the evaporative region. The evaporative region and condensing tubes together form a single, uninterrupted, sealed enclosure. The cooling system further includes a fluid disposed within the sealed disclosure. The cooling system further includes a plurality of spacers substantially filling gaps between the heat transfer plate and respective condensing tubes. Each of the spacers is configured as an independent component to allow the passage of fluid through an interior space of each spacer. The cooling system further includes a plurality of wicks. Each wick is positioned partially within a corresponding spacer to which the spacer is fluidically coupled.

In some implementations, at a least a portion of each wick contacts the heat transfer plate. In some implementations, the portion of each wick in contact with the heat transfer plate is oriented substantially parallel to the heat transfer plate. In some implementations, the portion of each wick in contact with the heat transfer plate covers less than three-quarters of a cross sectional area of an end of a corresponding spacer. In some implementations, the portion of each wick in contact with the heat transfer plate substantially covers an end of its corresponding spacer and extends in a direction parallel to the heat transfer plate beyond an edge of the corresponding spacer. In some implementations, each wick comprises a metal mesh. In some implementations, each spacer extends at least partially into a corresponding condensing tube. In some implementations, an inner surface of each condensing tube defines a plurality of grooves. In some implementations, the heat transfer plate comprises a plurality of fins extending away from the heat transfer plate within the sealed enclosure. In some implementations, the plurality of fins are arranged in an irregular fashion. In some implementations, the plurality of fins are arranged based on a variation in heat generation across the electronic circuit package surface in thermal contact with the heat transfer plate. In some implementations, at least a portion of the sealed enclosure is coated with a copper powder. In some implementations, the copper powder coating the sealed enclosure has a particle size of about 0.1 mm. In some implementations, the copper powder coating the sealed enclosure forms a coating having a thickness of about 0.3 mm. In some implementations, the copper powder coating coats a plurality of fins extending away from the heat transfer plate within the sealed enclosure. In some implementations, the copper powder coating coats at least one of the heat transfer plate and a surface of the evaporative region opposite the heat transfer plate within the sealed enclosure. In some implementations, the interiors of the condensing tubes are free from the copper powder coating. In some implementations, a diameter of each spacer flares outward proximate to the heat transfer plate. In some implementations, a portion of each spacer extends closer to the cooling plate than a remainder of the spacer. In some implementations, the condensing tubes are positioned about a perimeter of the sealed enclosure.

According to another aspect, the disclosure relates to a cooling system for an electronic circuit package. The cooling system includes a heat transfer plate positioned in thermal contact with an electronic circuit package surface. The heat transfer plate forms a bottom surface of an evaporative region of the cooling system. The cooling system further includes a plurality of condensing tubes in fluid communication with, and extending away from, the evaporative region. The evaporative region and condensing tubes together form a single, uninterrupted, sealed enclosure. Each of the plurality of condensing tubes includes a plurality of grooves. The cooling system further includes a fluid disposed within the sealed disclosure. The cooling system includes a plurality of wicks. Each wick is positioned such that one end is in contact with the heat transfer plate and an opposite end extends into a proximal end of a corresponding condensing tube for a distance that is less than 5% of the length of the corresponding condensing tube. In some implementations, each wick comprises a multi-layer copper mesh.

BRIEF DESCRIPTION OF THE DRAWINGS

The above and related objects, features, and advantages of the present disclosure will be more fully understood by reference to the following detailed description, when taken in conjunction with the following figures, wherein:

FIGS. 2A-2G describe multiple example configurations of spacers and wicks suitable for use in an electronic circuit package cooling system according to some implementations.

FIGS. 5A and 5B are diagrams of example configurations of fins suitable for incorporation into an electronic circuit package cooling system according to some implementations.

DETAILED DESCRIPTION

Figure 1:
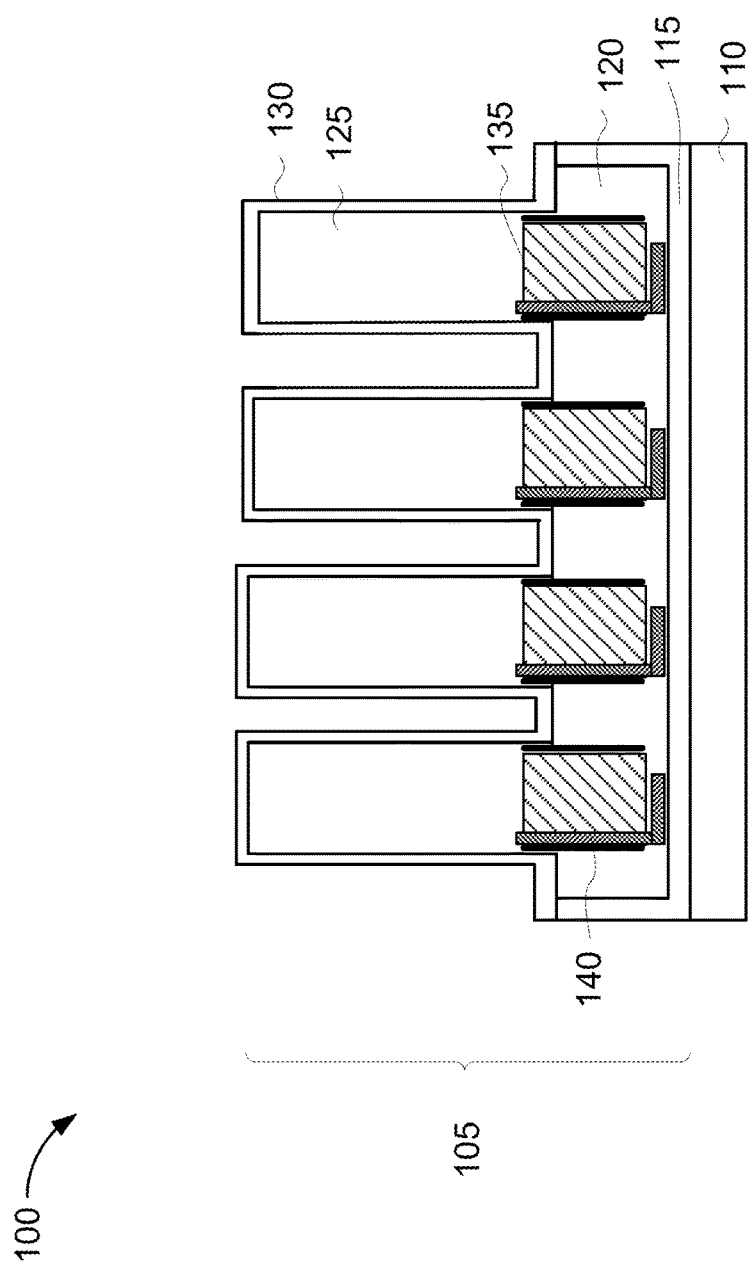
FIG. 1 is a diagram of an example electronic circuit package cooling system.

Heat dissipation is a major concern for manufacturers of electronic circuit packages, such as an integrated circuit die package. As manufacturers create electronic circuit packages (ECPs) with greater computing and processing capabilities, the need for improved cooling solutions also increases in order for users to gain the full benefit of these high-performance electronic circuit designs without being hindered by performance degradations due to sub-optimal management of heat that is generated by the more powerful ECP. Heat pipes and vapor chambers have often been used in this domain to cool ECPs. Typically, in legacy solutions, as ECP power increases, the cooling performance declines because the solutions are unable to dissipate enough heat at a fast enough rate to ensure optimal performance of the ECP. Often the cooling capacity of a particular heat pipe or vapor chamber design does not match the heat generation profile of a given ECP for which the cooling solution has been applied. As a result, temperatures in the ECP rise which can degrade ECP performance and/or negatively impact the life-span and reliability of the ECP. Cooling solutions that include liquid cooling methods are available but often involve increased cost and design complexity. The cooling systems disclosed herein can avoid the expensive design, manufacturing, and maintenance requirements that are typically associated with liquid cooling solutions. The disclosed cooling systems are also well-suited for deployment with high-power components (e.g., processors performing computationally intensive operations, such as machine learning applications) and may enable use of higher processor speeds to increase chip performance.

The disclosed cooling systems include a number of features to improve heat transfer away from an ECP to which the cooling system is attached. These features, alone and/or in combination, can help enable the evaporation process to be improved, and in some cases optimized, for a particular heat source, resulting in more efficient and consistent heat transfer away from high power density ECPs. The disclosed cooling systems may include a single continuous liquid-vapor chamber. The chamber may include an evaporator plate, which is in contact with the ECP and transfers heat into a liquid coolant that is included in the chamber. The liquid coolant may then evaporate as heat is absorbed from the ECP and the moisture vapor generated from the evaporating liquid may accumulate in the condensing tubes. In the condensing tubes, the heat contained in the moisture vapor may be transferred to the condensing tube walls and consequently to an external cooling medium (which may include water or air, or other fluids). The liquid condensate that accumulates on the inner surface of the condensing tube walls may then flow back to the evaporative region from the condensing tubes. The cooling system can include independent structures, referred to herein as spacers that fluidically couple the condensing tubes to the evaporative region. Such spacers may include a rigid component and/or a wick, to provide a continuous flow of liquid coolant for more efficient heat transfer. The spacer may act as a "bridge" between the end of the condensing tubes closest to the evaporator plate (referred to as the "proximal end") and the heat transfer plate of the evaporative portion of the chamber. The wicks may provide a wicking effect, drawing the condensate liquid from the condensing tubes back down into the evaporative portion of the chamber, rather than allowing the liquid to accumulate in the proximal end of the condensing tubes and drip down into the evaporator plate.

As an additional feature, the inner walls of the evaporative portion of the chamber may include surface coatings to improve evaporation efficiency. For example, a copper powder may coat the heat transfer plate and the surfaces of the chamber that are opposite the heat transfer plate. In some implementations, the surface coating may also coat the walls of the chamber and/or the inner walls of the condensing tubes. In some implementations, the inner walls of the condensing tubes lack a surface coating, and instead include a series of longitudinal grooves that extend the length of the condensing tubes.

In some implementations, the wick may include a multi-layer copper mesh extending between the condensing tubes and the heat transfer plate. In addition, fins may also be added to the internal surface of the heat transfer plate to increase the surface area of the heat transfer plate. The fins may also be coated with a copper coating to boost the evaporative efficiency of the cooling system.

The heat transfer plate may be attached to an upper portion of the chamber to form an enclosed, single-volume, continuous liquid-vapor cooling system. The condensing tubes may be connected to the sides of this enclosed chamber or to the top (or a combination of both connection configurations). As described above, the condensing tubes may include a wick to provide a capillary effect and improve fluid circulation between the evaporative and condensing regions of the chamber. Alternatively or in addition, the condensing tubes may include grooves to reduce the friction of the condensate on the condensing tube inner walls and may facilitate movement of the condensate back to the evaporative region.

The disclosed cooling system architecture enhances the air cooling capacity of the condensing tubes and addresses the problem of managing high heat flux that is typically generated by high power ASICs or microprocessors. Often, the configuration of high power processors included in an ECP can greatly affect the heat transfer performance of the cooling system used to cool the ECP. A solution to this problem may include a cooling system that is optimized for the configuration or layout of the high-performance components that are included in a particular ECP configuration. For example, an ECP configuration may be arranged such that numerous microprocessors are positioned around the perimeter of the ECP. A cooling system that includes design elements in the center of the ECP may not demonstrate the same heat transfer capabilities as a cooling system configured with heat transfer features that are similarly mapped or positioned in relation to the heat generating components of the ECP, such as cooling system features that are configured around the perimeter of the cooling system in positions corresponding to the heat generating processors of the ECP. One way the disclosed cooling systems disclosed herein address this problem is by enabling an ECP manufacturer to customize the shape, elevation and density of a plurality of fins that may be arranged on the heat transfer plate that is coupled to the ECP. The fins may be arranged in a uniform pattern or an irregular pattern that is designed to optimize the heat transfer away from the heat generating portions of the ECP over which the fins are located. In the disclosed cooling system, regions of the ECP with a greater density of heat-generating ASICs or microprocessors may be mapped and a heat transfer plate may be manufactured with a plurality of fins whose location, density and coating properties may be optimized to efficiently manage the heat generated by the microprocessors. For example, regions of the heat transfer plate located above components of an ECP that generate greater amounts of heat may be include a greater number of fins, a greater fin surface area, or a greater fin density (and thus greater heat transfer capacity) than regions of the heat transfer plate located above lower-powered integrated circuits in the ECP over which the heat transfer plate is located.

Additional details of the various design elements included in the disclosed cooling system will now be described in more detail.

FIG. 1 is a diagram of an example electronic circuit package cooling system 105. In broad overview, the cooling system 105 is coupled to an electronic circuit package (ECP) 110, such as an integrated circuit die package. The ECP 110 may further include one or more microprocessors, such as ASICs, field programmable gate arrays (FPGAs), or microprocessors. The cooling system 105 also includes a heat transfer plate 115. The cooling system includes an evaporative region 120 and a plurality of condensing regions 125. The cooling system 105 includes a plurality of condensing tubes 130 and a plurality of spacers 135. The cooling system 105 also includes a plurality of wicks 140.

As shown in FIG. 1, the cooling system 105 is formed as a single, uninterrupted, sealed enclosure or chamber. The cooling system 105 includes a heat transfer plate 105 forming the bottom or lower portion of the chamber and a plurality of condensing tubes 130 forming an upper portion of the chamber. The cooling system 105 includes an evaporative region 120 and a plurality of condensing regions 125, located within the condensing tubes 130. The upper portion of the chamber may be fitted as a lid to the lower portion of the chamber to create the single, continuous volume chamber. In some implementations, the chamber may include a liquid (e.g., water or a coolant fluid) to absorb the heat that is generated by the ECP 110. The generated heat is absorbed by the liquid within the evaporative region 120 and transferred to the condensing region 125 as the liquid evaporates. The evaporated liquid is transferred to the condensing tubes 130 as vapor where, as the vapor condenses on the walls of the condensing tubes 130, the heat is dissipated through the walls of the condensing tubes 130 into an external cooling medium surrounding the condensing tubes 130, such as air or water or another fluid. The condensate may then flow from the walls of the condensing tubes 130 back to the evaporative region 120.

The design of the single, continuous volume liquid-vapor chamber of the cooling system 105 may provide the benefit of allowing all the condensing tubes 130 to operate at the same temperature (assuming equal vapor pressure inside). In this way, the condensing tubes 130, when connected to the same chamber or volume of space (e.g., the evaporative region 120) and exposed to the lower temperature liquid present in the evaporative region 120, may transfer a higher heat load than if the condensing tubes 130 were not connected to the same chamber or volume of space or were otherwise located downstream of the liquid coolant. Thus, a single, continuous volume liquid-vapor chamber avoids uneven heat balancing among the condensing tubes 130 and further avoids intermediate thermal resistances, such as solder thermal resistance and/or copper heat spreader resistance that may form between the heat transfer plate 115 and the external cooling medium, e.g., air or water, in cooling system designs which include multiple internal chambers or heat dissipation structures.

As shown in FIG. 1, a heat transfer plate 110 is coupled to the ECP 105. The heat transfer plate 105 is positioned directly atop and mated to an ECP 105 so that heat generated by ECP 105 may be transmitted to the heat transfer plate 110 for further dissipation. The heat transfer plate 110 may be constructed of a metal or metal alloy possessing superior heat transfer qualities, such as copper or aluminum, so that the heat that is generated by the ECP 105 is efficiently transferred to the heat transfer plate 110 and into the cooling system 105 for further dissipation. The heat transfer plate 115 forms the lower portion or floor of the chamber formed by the cooling system 105. In some implementations, the heat transfer plate 115 may be coupled to the ECP 110 using a thermal transfer material.

As shown in FIG. 1, the cooling system 105 includes an evaporative region 120. The evaporative region 120 receives the heat generated by the ECP 110 and transferred to the heat transfer plate 115 to which it is coupled. The evaporative region 120 is the volume of space formed by heat transfer plate 115, the walls, and upper portion of the chamber of the cooling system 105. The evaporative region 120 may include a liquid, such as water or a coolant fluid (not shown), such as a dielectric refrigerant. The heat transferred from the heat plate 115 is absorbed by the liquid in the evaporative region 120 causing the liquid to evaporate into a vapor phase. The vapor carrying the transferred heat accumulates and condenses in the condensing regions 125. In some implementations, the cooling system 105 may include a fill tube (not shown) which is used in the manufacturing process to charge the cooling system 105 with a certain amount of liquid coolant or water. In some implementations, the volume of coolant to be used may be a volume which occupies between 10% and 50% of the internal volume of the cooling system chamber. The weight or amount of liquid that may be used to charge the cooling system 105 may be optimized or configured based on the power (and heat) map that is associated with the ECP to which the cooling system 105 is coupled.

As shown in FIG. 1, the cooling system 105 also includes a plurality of condensing regions 125. The condensing regions 125 are the volumes of space formed by the walls of the condensing tubes 130. The condensing regions 125 accumulate the evaporated liquid which was transformed into vapor and carries the heat transferred from the heat transfer plate 115 into the evaporative region 120. The vapor collects in the condensing regions 125 and condenses on the walls of the condensing tubes 130. The dimensions of the condensing regions 125 and the condensing tubes 130 from which they are formed may vary based on the heat transfer performance desired for a particular cooling system 105 and/or particular ECP 110. In some implementations, the condensing tubes 130 have a hydraulic diameter of approximately 2-15 mm and are approximately 20-500 mm tall. The condensing tubes 130 may be circular, rectangular, triangular, octagonal or have any other cross sectional shape. In some implementations, the condensing tubes 130 may be straight. In some implementations, the condensing tubes 130 may be bent at an angle. In some implementations, the condensing tubes 130 may be arranged vertically in relation to the heat transfer plate 115. In some implementations, the condensing tubes 130 may be arranged horizontally in relation to the heat transfer plate 115.

The condensing tubes 130 may be constructed of a metal or metal alloy with desirable heat transfer qualities, such as copper or aluminum, so that the heat that is present in the vapor which accumulates on the walls of the condensing tubes 130 may be efficiently transferred to an external medium surrounding the condensing tubes 130 such as air or water, allowing the vapor to condense back into a liquid phase. In some implementations, the inner surface of the condensing tubes 130 may include a coating, such as a copper powder coating. In other implementations, the inner surface of the condensing tubes 130 may be free of the copper powder coating, and may instead include a series of longitudinal grooves that extend the length or substantially the entire length of the condensing tubes 130.

As shown in FIG. 1, the cooling system 105 may include a plurality of spacers 135. The spacers 135 are independent components spanning the space within the evaporative region 120. The spacers 135 fill gaps between the between the heat transfer plate 115 and the respective condensing tubes 125. The spacers 135 are generally tubular and are configured to allow passage of fluid through the interior space of each spacer. The spacers 135 may improve the overall dry-out power of the condensing tube 130 to which it is attached by facilitating the flow of condensed evaporative liquid back toward the evaporative region 120. In some implementations, the spacers 135 may include a rigid outer structure such as a copper tube. In some implementations, the inner surface of the spacers 135 may include a coating to assist movement of the evaporative liquid back to the evaporative region 120. In some implementations, the spacers 135 may include a mesh wick in addition to the rigid outer structure. In some implementations, the spacers 135 may include only a metal mesh spacer and do not include a rigid outer structure.

As further shown in FIG. 1 the cooling system 105 includes a plurality of wicks 140. The wicks 140 provide a wicking (or capillary) effect to draw the condensed vapor that has accumulated at the lower portion of the condensing tubes 130 back to the evaporative region 120. For example, as heat is transferred through the walls of the condensing tubes 130, the vapor that carried the heat condenses on the walls of the condensing tubes 130 and migrates down the inner surface of the condensing tubes. The condensed liquid may accumulate at the lower portion of the condensing tubes 130. The wicks 140 may draw or wick the accumulated liquid from the lower portion of the condensing tubes 130 further down into the evaporative region near the heat transfer plate 115. The wicks 140 may enable a steady, continuous flow of liquid coolant through the cooling system 105 resulting in more uniform temperatures and greater heat transfer performance in all condensing tubes 130 compared to cooling system designs that utilize condensing tubes without a wick. In some implementations, the wick 140 may be included as a component of the spacer 135. In other implementations, the wick 140 may not be included as a component of the spacer 135.

FIGS. 2A-2G describe multiple example configurations of spacers and wicks suitable for use in the cooling system shown 105 shown in FIG. 1. FIGS. 2A-2F show aspects of various implementations of the cooling system 105, including heat transfer plates 215a-215f, condensing tubes 230a-230f, spacers 235a-235f, and wicks 240a-240f. FIG. 2G shows an implementation of a cooling system that includes all the elements of FIGS. 2A-2F, but excludes a spacer.

As shown in FIG. 2A, the cooling system 105 includes a spacer 235a that is positioned at the lower portion of the condensing tube 230a and extends at least partially into the corresponding condensing tube 230a. The spacer 235a spans substantially the entire evaporative region (e.g. between about 80%-100% of the gap between the end of the condensing tubes closest to the evaporator plate (referred to as the "proximal end") and the heat transfer plate of the evaporative portion of the chamber) such that one end of the spacer 235a is inserted into the condensing tube 230a, and the other end of the spacer 235a is in close proximity to or in contact with the heat transfer plate 215a. In some implementations, the inner surface of the spacer 235a may include a coating to facilitate the return of the condensed liquid coolant back to the evaporative region via the inner surfaces of the spacer 235a. For example, the inner surface of the spacer 235a may include a hydrophobic surface coating to reduce the surface friction of the liquid coolant and may facilitate movement of the liquid coolant from the condensing tube 230a back into the evaporative region of the cooling system 105.

As further shown in FIG. 2A, the spacer 235a includes a wick 240a. The wick 240a is positioned partially within the condensing tube 230a to which it is fluidically coupled. The wick 240a is positioned within the inner volume of the spacer 235a and extends upward to the lower portion of the condensing tube 230a. The spacer 235a extends downward toward the heat transfer plate 215a. The wick 240a is in contact with the heat transfer plate 215a. The portion of the wick 240a in contact with the heat transfer plate 215a is oriented substantially parallel to the heat transfer plate 215a for which it is in contact. In some implementations, the portion of the wick 240a in contact with the heat transfer plate 215a may be configured to cover different cross sectional dimensions of the spacer 235a to which it corresponds. In some implementations, the portion of the wick 240a that is oriented substantially parallel to the heat transfer plate 215a, may cover between 15-30% of the cross sectional area of an end of the corresponding spacer 235a, for example 25% of the cross sectional area of an end of the corresponding spacer 235a. In some implementations, the portion of the wick 240a that is oriented substantially parallel to the heat transfer plate 215a, may cover between 40-60% of the cross sectional area of an end of the corresponding spacer 235a, for example 50% of the cross sectional area of an end of the corresponding spacer 235a. In some implementations, the portion of the wick 240a that is oriented substantially parallel to the heat transfer plate 215a, may cover between 70-90% of the cross sectional area of an end of the corresponding spacer 235a, for example 75% of the cross sectional area of an end of the corresponding spacer 235a.

As shown in FIG. 2B, all of the elements described in relation to FIG. 2A remain the same, except that the wick 240b shown in FIG. 2B extends beyond the spacer 235b and further into the proximal end of the condensing tube 230b. Extending the wick 240b further into the condensing region created by the condensing tube 230b may provide a greater wicking effect and draw a greater amount of liquid coolant that has condensed on the inner surfaces of the condensing tube 230b back toward the heat transfer plate 215b. In some implementations, the wick 240b may extend into the proximal end of condensing tube 230b for a distance that is between 0-10% of the length of the corresponding condensing tube, for example less than 5% of the length of the corresponding condensing tube. In some implementations, the wick 240b may extend into the proximal end of condensing tube 230b for a distance that is between 10-50% of the length of the corresponding condensing tube, for example 35% of the length of the corresponding condensing tube. In some implementations, the wick 240b may extend into the proximal end of condensing tube 230b for a distance that is between 50-100% of the length of the corresponding condensing tube, for example 75% of the length of the corresponding condensing tube.

As shown in FIG. 2C, all of the elements described in relation to FIG. 2A remain the same, except that the spacer 235c shown in FIG. 2C is configured to flare outward proximate to the heat transfer plate 215c. For example, the diameter of the spacer proximate to the heat transfer plate 215c can be between 1.25-2.0 times the diameter of the spacer where it enters the condensing tube 230c.

As shown in FIG. 2D, all of the elements described in relation to FIG. 2C remain the same, except that the wick

240*d* shown in FIG. 2D is configured to extend beyond the spacer 235*d* and further into the proximal end of the condensing tube 230*d*, similar to the wick 240*b* as shown in FIG. 2B. In some implementations, the wick 240*d* may extend into the proximal end of condensing tube 230*d* for a distance that is between 0-10% of the length or height of the corresponding condensing tube, for example less than 5% of the length of the corresponding condensing tube. In some implementations, the wick 240*d* may extend into the proximal end of condensing tube 230*d* for a distance that is between 10-50% of the length or height of the corresponding condensing tube, for example 35% of the length of the corresponding condensing tube. In some implementations, the wick 240*d* may extend into the proximal end of condensing tube 230*d* for a distance that is between 50-95% of the length or height of the corresponding condensing tube, for example 75% of the length of the corresponding condensing tube.

As shown in FIG. 2E, all of the elements described in relation to FIG. 2A remain the same, except that as shown in FIG. 2E, the portion of the wick 240*e* that is oriented substantially parallel to the heat transfer plate 215*e* extends to cover a smaller portion of the cross sectional area of an end of the corresponding spacer 235*e* than the wick 240*a* shown in FIG. 2A. For example, the portion of the wick 240*e* that is oriented substantially parallel to the heat transfer plate 215*e* may extend to cover 5% of the cross sectional area of an end of the spacer 235*e*. In some implementations, the portion of the wick that is oriented substantially parallel to the heat transfer plate 215*e* may extend to cover less than 5%, less than 10%, or less than 20% of the cross sectional area of an end of the spacer 235*e*. In some implementations, the wick shown in FIG. 2E may be configured within a flared spacer, such as spacer 235*c* of FIG. 2C. In some implementations, the wick 240*e* shown in FIG. 2E may be configured to extend substantially into the condensing tube 230*e* as shown by the wick 240*b* in FIG. 2B. In some implementations, the wick 240*e* of FIG. 2E may be configured in a flared spacer, such as spacer 235*d* in FIG. 2D and may be further configured to extend through the flared spacer substantially into the corresponding condensing tube 230*e*, such as the wick 240*d* shown in FIG. 2D.

As shown in FIG. 2F, all of the elements described in relation to FIG. 2A remain the same, except that as shown in FIG. 2F, a portion of the wick 240*f* extends to cover an end of its corresponding spacer 235*f* and further extends in a direction beyond an edge of the corresponding spacer 235*f*. In some implementations, the portion of the wick 240*f* that is oriented substantially parallel to the heat transfer plate 215*f* may extend beyond an edge of the corresponding spacer 235*f* by approximately 0-10% of the width or diameter of the corresponding spacer. For example the portion of the wick 240*f* that is oriented substantially parallel to the heat transfer plate 215*f* may extend beyond an edge of the corresponding spacer 235*f* by approximately less than 5% of the width or diameter of the corresponding spacer 235*f*. In some implementations, the portion of the wick 240*f* that is oriented substantially parallel to the heat transfer plate 215*f* may extend beyond an edge of the corresponding spacer 235*f* by approximately 15-50% of the width or diameter of the corresponding spacer. For example the portion of the wick 240*f* that is oriented substantially parallel to the heat transfer plate 215*f* may extend beyond an edge of the corresponding spacer 235*f* by approximately 45% of the width or diameter of the corresponding spacer 235*f*. In some implementations, the portion of the wick 240*f* that is oriented substantially parallel to the heat transfer plate 215*f* may extend beyond an edge of the corresponding spacer 235*f* by approximately 60-90% of the width or diameter of the corresponding spacer. For example the portion of the wick 240*f* that is oriented substantially parallel to the heat transfer plate 215*f* may extend beyond an edge of the corresponding spacer 235*f* by approximately 85% of the width or diameter of the corresponding spacer 235*f*. In some implementations, the wick shown in FIG. 2F may be configured within a flared spacer, such as spacer 235*c* of FIG. 2C. In some implementations, the wick 240*f* shown in FIG. 2F may be configured to extend substantially into the condensing tube 230*f* as shown by the wick 240*b* in FIG. 2B. In some implementations, the wick 240*f* of FIG. 2F may be configured in a flared spacer, such as spacer 235*d* in FIG. 2D, and may be further configured to extend through the flared spacer substantially into the corresponding condensing tube 230*f*, such as the wick 240*d* shown in FIG. 2D.

As shown in FIG. 2G, the wick 240*g* is positioned similarly to the wick 240*a* described in FIG. 2A, however the cooling system 105 shown in FIG. 2G excludes a spacer, such as the spacer 235*a* shown in FIG. 2A. The wick 240*g* shown in FIG. 2G is configured positioned such that one end is in contact with the heat transfer plate 215*g* and the opposite end extends into a proximal end of a corresponding condensing tube 230*g* for a distance that is between 0-10% of the length or height of the corresponding condensing tube, for example less than 5% of the length or height of the corresponding condensing tube 230*g*. In some implementations, the wick 240*g* may extend into the proximal end of condensing tube 230*g* for a distance that is between 10-50% of the length or height of the corresponding condensing tube, for example 40% of the length of the corresponding condensing tube. In some implementations, the wick 240*g* may extend into the proximal end of condensing tube 230*g* for a distance that is between 50-100% of the length or height of the corresponding condensing tube, for example 80% of the length of the corresponding condensing tube. In some implementations, the wick 240*g* includes a metal mesh wick. For example, the wick 140 may include a copper mesh wick. In some implementations, the wick 240*g* includes a multi-layer metal mesh, such as a multi-layer copper mesh wick.

In some implementations, the portion of the mesh wick 240*g* in contact with the heat transfer plate 215*g* may extend to cover a small portion of the cross sectional area of the condensing tube 230*g*. For example, the portion of the wick 240*g* that is oriented substantially parallel to the heat transfer plate 215*g* may extend to cover less than 5% of the cross sectional area of the condensing tube 230*g*. In some implementations, the portion of the wick that is oriented substantially parallel to the heat transfer plate 215*g* may extend to cover 10-40% of the cross sectional area of the condensing tube 230*g*, for example 25% of the cross sectional area of the condensing tube 230*g*. In some implementations, the portion of the wick that is oriented substantially parallel to the heat transfer plate 215*g* may extend to cover 40-90% of the cross sectional area of the condensing tube 230*g*, for example 75% of the cross sectional area of the condensing tube 230*g*.

In some implementations, the portion of the wick 240*g* that is oriented substantially parallel to the heat transfer plate 215*g* extends to cover an end of its corresponding condensing tube 230*g* and further extends in a direction beyond an edge of the corresponding condensing tube 230*g*. In some implementations, the portion of the wick 240*g* that is oriented substantially parallel to the heat transfer plate 215*g* may extend beyond an edge of the corresponding condensing tube 230*g* by approximately 0-10% of the width or diameter of the corresponding condenser tube. For example the portion of the wick 240g that is oriented substantially parallel to the heat transfer plate 215g may extend beyond an edge of the corresponding condensing tube 230g by approximately less than 5% of the width or diameter of the corresponding condenser tube 230g. In some implementations, the portion of the wick 240g that is oriented substantially parallel to the heat transfer plate 215g may extend beyond an edge of the corresponding condensing tube 230g by approximately 15-50% of the width or diameter of the corresponding condenser tube. For example the portion of the wick 240g that is oriented substantially parallel to the heat transfer plate 215g may extend beyond an edge of the corresponding condensing tube 230g by approximately 45% of the width or diameter of the corresponding condenser tube 230g. In some implementations, the portion of the wick 240g that is oriented substantially parallel to the heat transfer plate 215g may extend beyond an edge of the corresponding condensing tube 230g by approximately 60-90% of the width or diameter of the corresponding condenser tube. For example the portion of the wick 240g that is oriented substantially parallel to the heat transfer plate 215g may extend beyond an edge of the corresponding condensing tube 230g by approximately 85% of the width or diameter of the corresponding condenser tube 230g.

Figure 3:
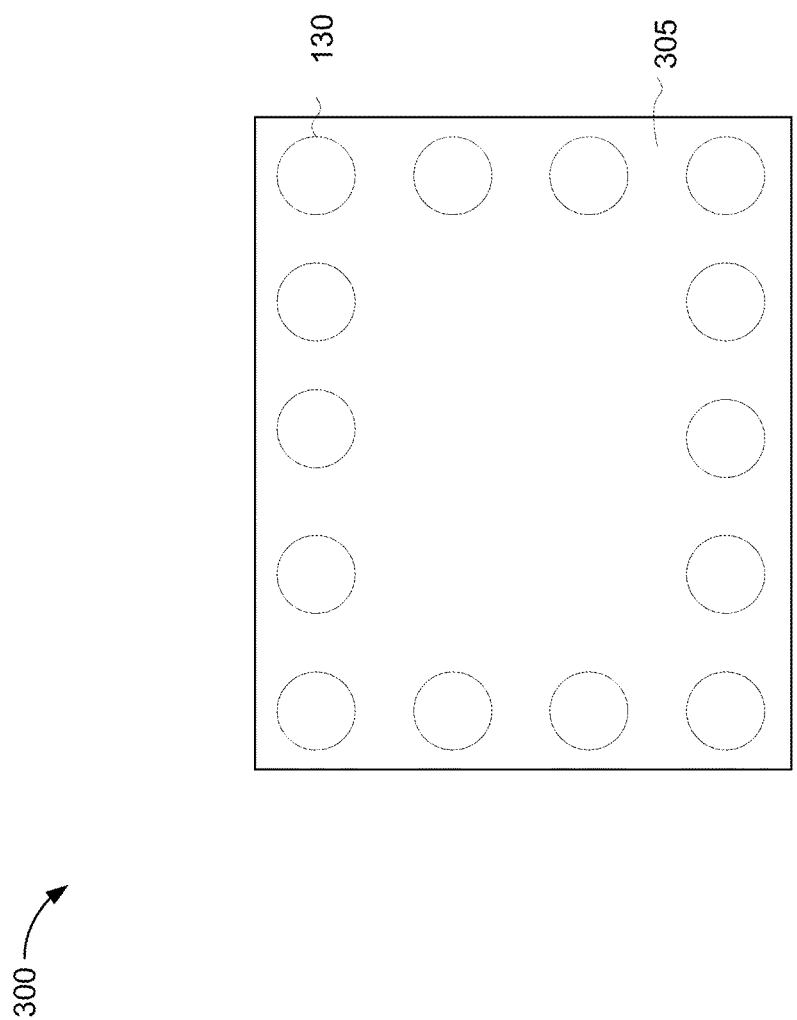
FIG. 3 is a top view of the example electronic circuit package cooling system illustrating an example arrangement of condensing tubes in an electronic circuit package cooling system according to some implementations.

FIG. 3 is a top view of the example cooling system 105 shown in FIG. 1, illustrating an example arrangement 300 of condensing tubes 130 in an electronic circuit package cooling system 105. The arrangement 300 includes a plurality of condensing tubes 130 positioned about the perimeter of the upper surface 305 of the chamber or sealed enclosure of the cooling system 105. In some implementations, the positioning of the cooling tubes 130 may be determined in relation to a heat map or heat generation profile of the ECP to which the cooling system 105 is attached. For example, in some implementations, if the ECP generates more heat towards the center of the ECP, the plurality of condensing tubes 105 may be positioned towards the center of the chamber of the cooling system 105. In other implementations, the condensing tubes 130 may be positioned in the corners or on opposite sides of the chamber of the cooling system 105.

Figure 4:
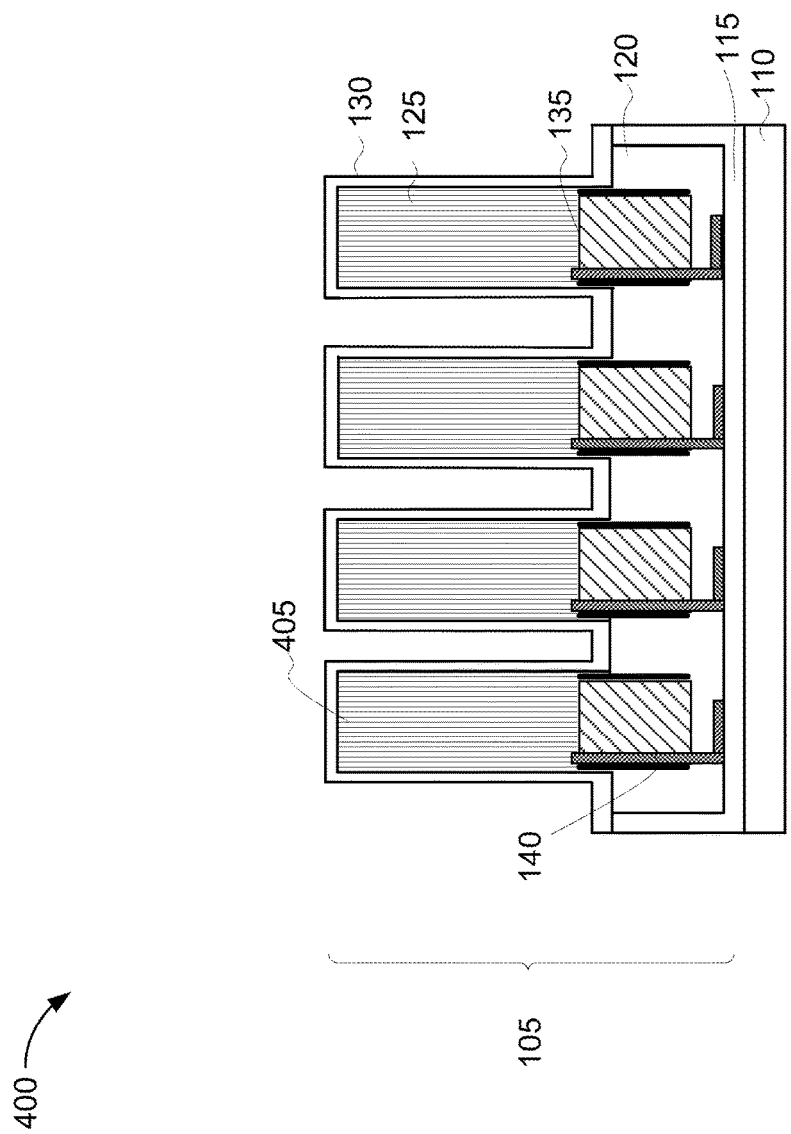
FIG. 4 is a diagram of the electronic circuit package cooling system illustrating an example arrangement of grooved condensing tubes in an electronic circuit package cooling system according to some implementations.

FIG. 4 is a diagram of the electronic circuit package cooling system illustrating an example arrangement 400 of grooved condensing tubes in an electronic circuit package cooling system 105 shown in FIG. 1. As shown in FIG. 4, the cooling system 105 includes the same elements as the cooling system 105 shown in FIG. 1, except that the inner surface of each condensing tube 130 includes a plurality of grooves 405. The plurality of grooves 405 are oriented vertically within the condensing tubes 130 when the condensing tubes 130 are positioned atop the chamber of the cooling system 105 as shown in FIG. 4. In configurations where the condensing tubes are located on the sides of the chamber of the cooling system 105 (not shown), the plurality of grooves 405 may be oriented in a manner such that the grooves are parallel to the length of the condensing tubes 130. The grooves 405 that are in the inner walls of the condensing tubes 130 may provide a capillary effect for condensed liquid coolant and may act as channels for the flow of condensed liquid coolant to return to the evaporative region 120, thereby reducing the condensation fluid resistance on the inner surface of the condensing tube walls. By aiding the return of the liquid coolant to the evaporative region 120, the heat transfer performance of the cooling system 105 may be enhanced as the system is able to cycle the liquid coolant more quickly from the evaporative region to the condensing region and back again to the evaporative region.

A variety of groove configurations may be applied to the inner surface of the condensing tubes 130. In some implementations, the groove shape or cross sectional profile of the grooves may be a rectangular shape, a square shape, a rounded shape, and/or "v"-shape. In some implementations, a mixture of groove shapes, depths and/or spacing configurations may be used within one or more condensing tubes 130 of cooling system 105. In some implementations, the depth of each groove may be between 0.05 mm to 1 mm. In some implementations, the spacing between each groove may be between 0.05 mm to 1 mm.

FIGS. 5A and 5B are diagrams of example configurations 500a and 500b of fins suitable for incorporation into an electronic circuit package cooling system 105 shown in FIG. 1. As shown in FIG. 5A, the configuration 500a includes a heat transfer plate, such as heat transfer plate 115 shown in FIG. 1. The heat transfer plate 115 includes a plurality of fins 505. The heat transfer plate 115 also includes one or more coated fins 510. In broad terms, the plurality of fins 505 are features of the cooling system 105 that are configured to further enhance the heat transfer performance of the cooling system 105. As described in relation to FIG. 1, the heat transfer plate 115 is coupled to an ECP such that the heat transfer plate 115 forms the floor or lower portion of the evaporative region of the cooling system chamber. As shown in FIG. 5A, the heat transfer plate 115 is configured with a plurality of fins 505 extending away from the heat transfer plate 115 within the sealed enclosure or chamber of the cooling system 105. The fins 505 may be configured on the heat transfer plate 115 such that the plurality of fins are uniformly arranged so that each fin 505 has the same height, thickness, gap spacing, and orientation as other fins.

As further shown in FIG. 5A, the heat transfer plate 115 includes a coated fin 510. The uniform arrangement of fins 505 may include one or more coated fins 510. The coating may include an evaporative surface coating, such as a copper powder that is sintered onto the surface of the fins 510. In some implementations, the coating thickness may be a thickness between about 0.01 and about 1 mm. In some implementations, the particle size of the copper powder coating may be a particle size between about 0.01 and about 0.2 mm. In some implementations, the coated fins 510 may include other surface enhancements to further aid heat transfer performance, such as a metal mesh or surface roughness to increase the surface area of the fin.

As shown in FIG. 5B, the configuration 500b includes a heat transfer plate, such as the heat transfer plate 115 of FIG. 1. The heat transfer plate 115 includes a plurality of fins 515. The heat transfer plate also includes one or more coated fins 520. As described in relation to FIG. 5A, the arrangement and function of the plurality of fins that are positioned on the heat transfer plate 115 may enhance the heat transfer performance of the cooling system 105. The plurality of fins 515 includes fins that have an irregular shape. For example, as shown in FIG. 5B, the configuration 500b includes a plurality of irregularly shaped fins 515, which each have three ridges and a valley between two ridges. The fins 515 may be configured on the heat transfer plate 115 such that the plurality of irregularly shaped fins 515 have different heights, thicknesses, gap spaces, and/or orientations. In some implementations, the irregular arrangement of the fins 515 may be configured based on the heat map or heat generation profile of the ECP to which the heat transfer plate 115 is attached.

As further shown in FIG. 5B, the heat transfer plate 115 includes a coated fin 520 having an irregular arrangement. For example, the irregular arrangement of fins 515 may include one or more coated fins 520. The coating may include an evaporative surface coating, such as a copper powder that is sintered onto the surface of the fins 520. In some implementations, the coating thickness may be a thickness between about 0.01 and about 1 mm. In some implementations, the particle size of the copper powder coating may be a particle size between about 0.01 and about 0.2 mm. The irregular arrangement of the coated fins 520 may be configured based on the heat map or heat generation profile of the ECP to which the heat transfer plate 115 is attached so that the heat transfer plate 115 includes a greater density of fins or great fin surface area directly over the regions of the ECP which generate the most heat. For example, the heat generation profile of the ECP to which the heat transfer plate 115 is coupled may include three distinct regions which generate high heat and thus require greater heat transfer to maintain proper operating conditions of the ECP components. Accordingly, the heat transfer plate 115 may be configured such that the plurality of irregular shaped fins 515 are arranged with greater fin height, thickness and/or density directly over the three highest heat producing regions. As shown in FIG. 5B, the three ridges of each irregularly shaped fin 515 may correspond to the three highest heat producing regions of the ECP, while the two valleys of each irregularly shaped fin 515 may correspond to lower heat producing regions of the ECP. In some implementations, the coated fins 520 may include other surface enhancements to further aid heat transfer performance, such as a metal mesh or surface roughness to increase the surface area of the fin.

Figure 6:
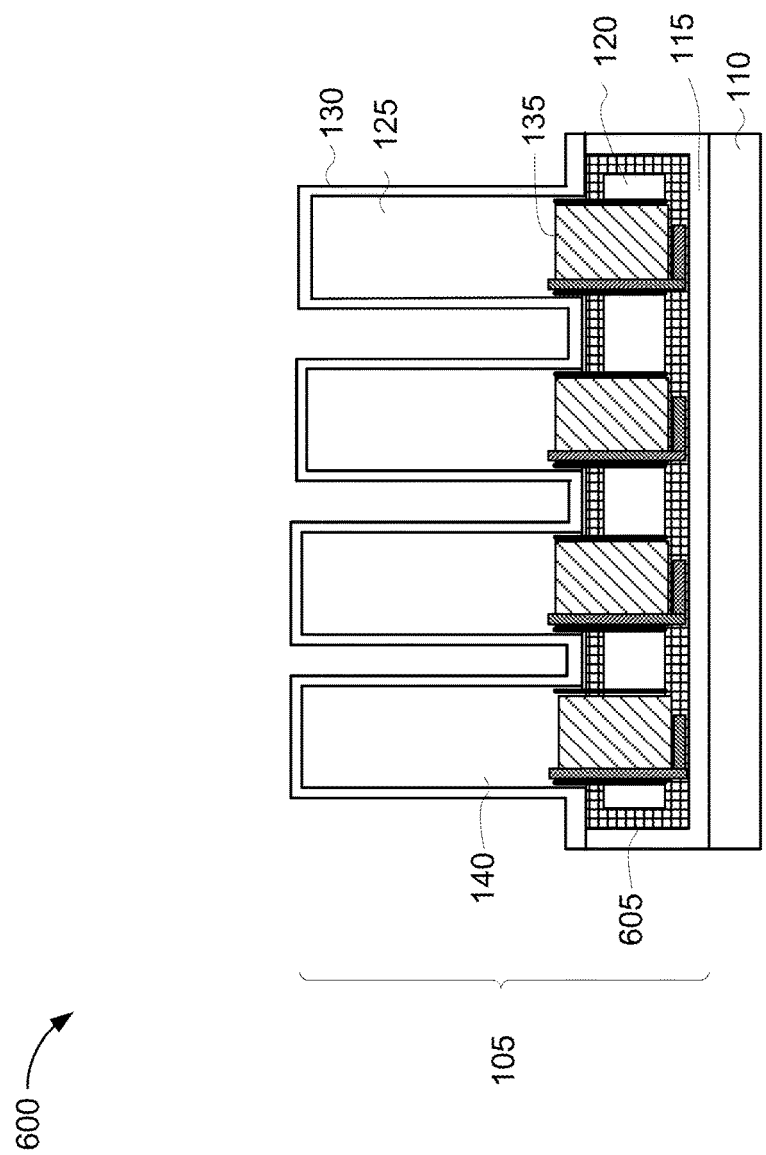
FIGS. 6 and 7 are diagrams of example coating configurations within the evaporative region of an electronic circuit package cooling system according to some implementations.

FIG. 6 is a diagram of an example coating configuration 600 within the evaporative region of an electronic circuit package cooling system, such as the cooling system 105 shown in FIG. 1. As shown in FIG. 6, the cooling system 105 includes a coating 605. The coating 605 is included on the surfaces of each of the inner walls of the chamber forming evaporative region 120. The coating 605 may be an evaporative surface coating, such as a copper powder that is sintered onto the inner wall surface of the chamber forming the evaporative region 120. The coating 605 may enhance the heat transfer performance of the cooling system 105 by improving the evaporative efficiency of the heat transfer plate 115 and the inner wall surfaces of the chamber forming the evaporative region 120 to which the coating 605 is applied. The coating may include an evaporative surface coating, such as a copper powder that is sintered onto the inner surface of the walls of the chamber forming the evaporative region 120. In some implementations, the coating thickness may be a thickness between about 0.01 and about 1 mm. In some implementations, the particle size of the copper powder coating may be a particle size between about 0.01 and about 0.2 mm. In some implementations, the inner surface of the walls of the chamber forming the evaporative region 120 may include other surface enhancements, such as a metal mesh or surface roughness to increase the surface area of the wall surfaces and further enhance the heat transfer performance of the evaporative region 120.

Figure 7:
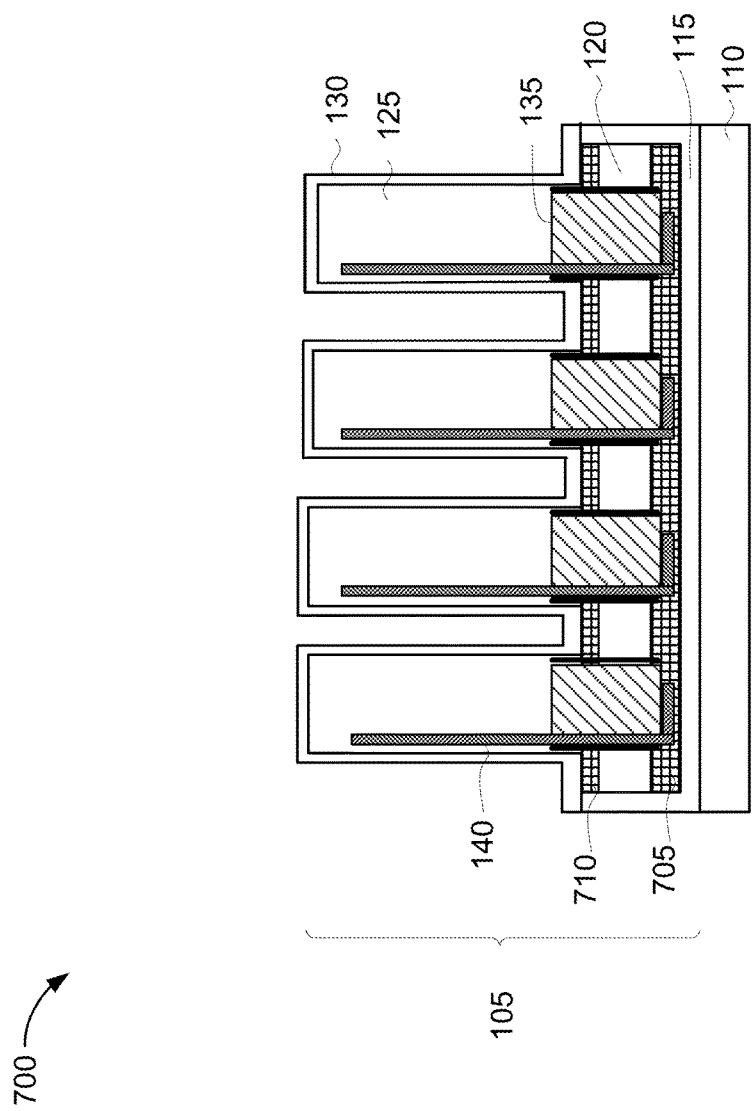

FIG. 7 is also a diagram of an example coating configuration 700 within the evaporative region of an electronic circuit package cooling system 105 shown in FIG. 1. As shown in FIG. 7, the cooling system 105 includes a coating 705 applied to the surface of the heat transfer plate 115 and also includes a coating 710 applied to the upper portion of the chamber forming the evaporative region 120. The coating 705 is included on the surface of the heat transfer plate 115 and covers the heat transfer plate 115 from one side of the evaporative region 120 to the other side of the evaporative region 120. The coating 710 is included on the inner surface wall of the upper portion of the chamber forming the evaporative region 120. The coating, 705 and/or 710, may be an evaporative surface coating, such as a copper powder that is sintered onto the inner wall surface of the chamber forming the evaporative region 120. The coating 705 and/or 710 may enhance the heat transfer performance of the cooling system 105 by improving the absorption of heat from the heat transfer plate 115 and improving the evaporative function of upper portion of the chamber forming the evaporative region 120. The coating 705 and/or 710 may include an evaporative surface coating, such as a copper powder that is sintered onto the inner surface of the walls of the chamber forming the evaporative region 120. In some implementations, the thickness of coating 705 and/or 710 may be a thickness between about 0.01 and about 1 mm. In some implementations, the coating particle size may be a particle size between about 0.01 and about 0.2 mm. In some implementations, the inner surface of the walls of the chamber forming the evaporative region 120 may include other surface enhancements, such as a metal mesh or surface roughness to increase the surface area of the wall surfaces and further enhance the heat transfer performance of the evaporative region 120.

Figure 8:
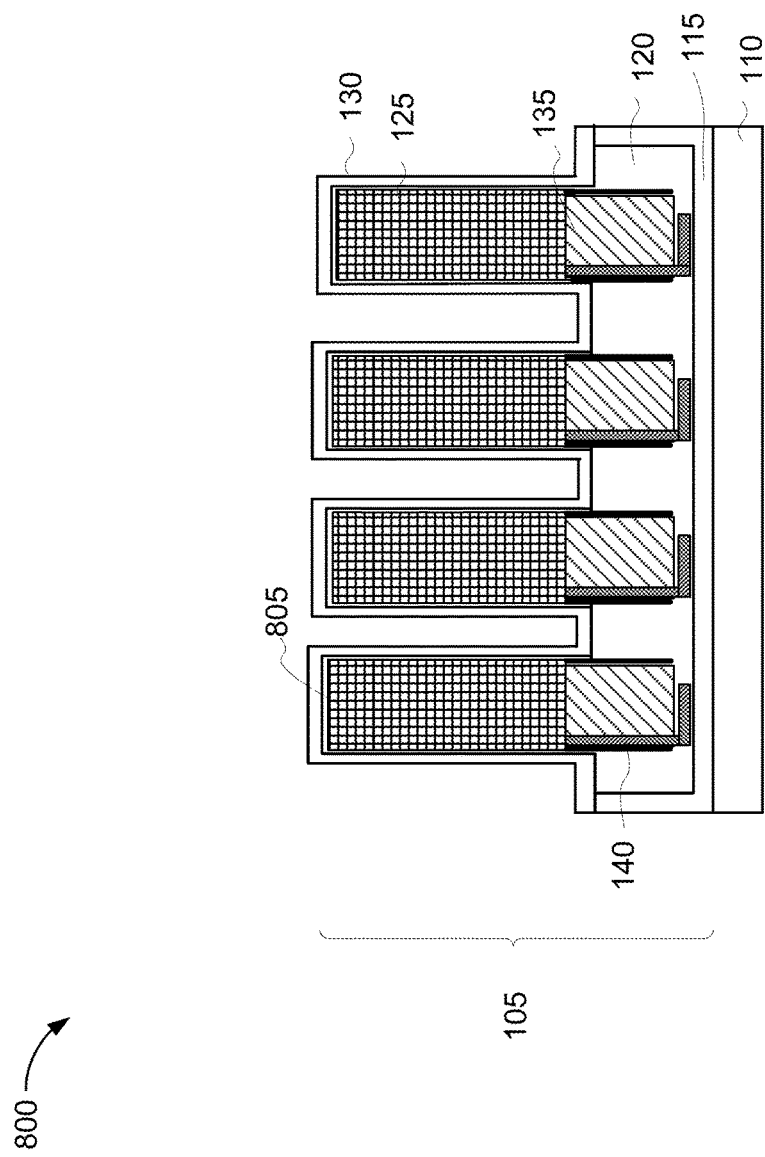
FIG. 8 is a diagram of an example coating configuration within the condensing region of an electronic circuit package cooling system according to some implementations.

FIG. 8 is a diagram of an example coating configuration 800 within the condensing region of an electronic circuit package cooling system, such as the cooling system 105 shown in FIG. 1. As shown in FIG. 8, the cooling system 105 includes a coating 805. The coating 805 is included on the inner surfaces of the condensing tubes 130. The coating 805 may be a hydrophobic surface coating which functions to reduce the surface friction of the liquid coolant condensed on the inner surface of the walls of the condensing tubes 130. By reducing the surface friction, the coating 805 may facilitate the movement of the condensed liquid coolant back into the evaporative region of the cooling system 105. For example, the coating 805 may be a surface coating, such as a sintered copper powder. The sintered copper powder may include powder particle sizes between 0.01 mm and 0.5 mm. The sintered copper power may be sintered on the inner surface of the condensing tubes 130 to form a surface coating with a thickness between 0.01 mm and 2.0 mm. In some implementations, the condensing tubes 130 may include both a coating 805 and a plurality of grooves, such as the grooves 405 as shown in FIG. 4. For example, the coating 805 may be applied to the inner surface of the condensing tube walls after a plurality of grooves has been formed on the inner wall surfaces of the condensing tubes 130.

While this specification contains many specific implementation details, these should not be construed as limitations on the scope of any inventions or of what may be claimed, but rather as descriptions of features specific to particular implementations of particular inventions. Certain features that are described in this specification in the context of separate implementations can also be implemented in combination in a single implementation. Conversely, various features that are described in the context of a single implementation can also be implemented in multiple implementations separately or in any suitable sub-combination. Moreover, although features may be described above as acting in certain combinations and even initially claimed as such, one or more features from a claimed combination can in some cases be excised from the combination, and the claimed combination may be directed to a sub-combination or variation of a sub-combination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the implementations described above should not be understood as requiring such separation in all implementations, and it should be understood that the described program components and systems can generally be integrated together in a single software product or packaged into multiple software products.

References to "or" may be construed as inclusive so that any terms described using "or" may indicate any of a single, more than one, and all of the described terms. The labels "first," "second," "third," and so forth are not necessarily meant to indicate an ordering and are generally used merely to distinguish between like or similar items or elements.

Various modifications to the implementations described in this disclosure may be readily apparent to those skilled in the art, and the generic principles defined herein may be applied to other implementations without departing from the spirit or scope of this disclosure. Thus, the claims are not intended to be limited to the implementations shown herein, but are to be accorded the widest scope consistent with this disclosure, the principles and the novel features disclosed herein.

What is claimed is:

1. A cooling system for an electronic circuit package, comprising:
   a heat transfer plate positioned in thermal contact with an electronic circuit package surface, wherein the heat transfer plate forms a bottom surface of an evaporative region of the cooling system;
   a plurality of condensing tubes in fluid communication with, and extending away from, the evaporative region, such that the evaporative region and condensing tubes together form a single, uninterrupted, sealed enclosure;
   a fluid disposed within the sealed disclosure;
   a plurality of spacers substantially filling gaps between the heat transfer plate and respective condensing tubes, wherein each of the spacers is configured as an independent component to allow the passage of fluid through an interior space of each spacer; and
   a plurality of wicks, each wick positioned partially within a corresponding spacer to which a corresponding condensing tube is fluidically coupled.

2. The cooling system of claim 1, wherein at a least a portion of each wick contacts the heat transfer plate.

3. The cooling system of claim 2, wherein the portion of each wick in contact with the heat transfer plate is oriented substantially parallel to the heat transfer plate.

4. The cooling system of claim 2, wherein the portion of each wick in contact with the heat transfer plate covers less than three-quarters of a cross sectional area of an end of a corresponding spacer.

5. The cooling system of claim 2, wherein the portion of each wick in contact with the heat transfer plate substantially covers an end of its corresponding spacer and extends in a direction parallel to the heat transfer plate beyond an edge of the corresponding spacer.

6. The cooling system of claim 1, wherein each wick comprises a metal mesh.

7. The cooling system of claim 1, wherein each spacer extends at least partially into a corresponding condensing tube.

8. The cooling system of claim 1, wherein an inner surface of each condensing tube defines a plurality of grooves.

9. The cooling system of claim 1, wherein the heat transfer plate comprises a plurality of fins extending away from the heat transfer plate within the sealed enclosure.

10. The cooling system of claim 9, wherein the plurality of fins are arranged in an irregular fashion.

11. The cooling system of claim 10, wherein the plurality of fins are arranged based on a variation in heat generation across the electronic circuit package surface in thermal contact with the heat transfer plate.

12. The cooling system of claim 1, wherein at least a portion of the sealed enclosure is coated with a copper powder.

13. The cooling system of claim 12, wherein the copper powder has a particle size of about 0.1 mm.

14. The cooling system of claim 12, wherein the copper powder forms a coating having a thickness of about 0.3 mm.

15. The cooling system of claim 14, wherein the copper powder coating coats a plurality of fins extending away from the heat transfer plate within the sealed enclosure.

16. The cooling system of claim 14, wherein the copper powder coating coats at least one of the heat transfer plate and a surface of the evaporative region opposite the heat transfer plate within the sealed enclosure.

17. The cooling system of claim 12, wherein the interiors of the condensing tubes are free from the copper powder coating.

18. The cooling system of claim 1, wherein a diameter of each spacer flares outward proximate to the heat transfer plate.

19. The cooling system of claim 1, wherein a portion of each spacer extends closer to the heat transfer plate than a remainder of the spacer.

20. The cooling system of claim 1, wherein the condensing tubes are positioned about a perimeter of the sealed enclosure.

* * * * *